(12) United States Patent
Bedarida et al.

(10) Patent No.: US 6,734,701 B2
(45) Date of Patent: May 11, 2004

(54) FAST CONTROLLED OUTPUT BUFFER

(75) Inventors: Lorenzo Bedarida, Vinercate (IT);
Stefano Sivero, Vergiate (IT); Davide Manfre, Bologna (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/323,614

(22) Filed: Dec. 18, 2002

(65) Prior Publication Data

US 2004/0051554 A1 Mar. 18, 2004

(30) Foreign Application Priority Data

Sep. 18, 2002 (IT) ................. TO2002A000811

(51) Int. Cl.[7] ........................ H03K 17/16; H03K 19/094
(52) U.S. Cl. ................... 326/27; 326/33; 326/83
(58) Field of Search .................. 326/26–28, 31–34, 326/82–83, 86, 87; 327/108

(56) References Cited

U.S. PATENT DOCUMENTS

| 4,894,561 A | * | 1/1990 | Nogami ................. 326/27 |
| 5,367,210 A | * | 11/1994 | Lipp ..................... 326/26 |
| 6,130,549 A | * | 10/2000 | Buck .................... 326/26 |
| 6,160,416 A | | 12/2000 | Adduci et al. ........... 326/21 |
| 2002/0093374 A1 | | 7/2002 | Bedarida et al. ......... 327/538 |

FOREIGN PATENT DOCUMENTS

| EP | 1 217 744 A1 | 6/2002 | ......... H03K/19/003 |
| EP | 1 221 771 A1 | 7/2002 | ......... H03K/17/16 |
| JP | 03121618 A | * 5/1991 | ......... H03K/19/08 |

* cited by examiner

*Primary Examiner*—James H. Cho
(74) *Attorney, Agent, or Firm*—Sierra Patent Group, Ltd.

(57) ABSTRACT

An output buffer switch-on control circuit includes several transistors and a discharge current control circuit. A first transistor has a first terminal connected to an internal voltage line and is controlled by an output data source. A second transistor has a first terminal connected to the internal voltage line and is controlled by a second terminal of the first transistor. The second transistor also has a second terminal connected to a first terminal of an output capacitor. A third transistor is controlled by the output data source and has a first terminal connected to a common voltage. A fourth transistor is digitally controlled and has a first terminal connected to the second terminal of the second transistor. The fourth transistor also has a second terminal connected to the common voltage. The discharge current control circuit is preferably actively-controlled and is connected between a second terminal of the first transistor and a second terminal of the third transistor. The discharge current control circuit preferably includes a discharge resistor and a mirrored current transistor feedback controlled by an output capacitor.

20 Claims, 6 Drawing Sheets

FAST CONTROLLED OUTPUT BUFFER

PRIORITY

This application claims the benefit of priority to Italian patent application number TO2002A000811, filed on Sep. 18, 2002.

BACKGROUND OF THE INVENTION

1. Field of the Invention

The invention relates to output buffers, and particularly to controlling an internal VDDQ reference voltage around a target value when short capacitor charge times are desired.

2. Discussion of the Related Art

In integrated devices, an internal power source may be viewed as an RLC model (resistance-inductance-capacitance) between an external pin and integrated transistors. A schematic representation of a simplified circuit according to this model is illustrated at FIG. 1. FIG. 1 shows an external voltage or $VDDQ_{GEN}$ (or VDDQ_GEN in FIG. 1) connected through inductance L to resistors $R_i, \ldots, R_n$ and capacitors $C_i, \ldots, C_n$, wherein the capacitors $C_i, \ldots, C_n$ power the internal voltages or $VDDQ_{internal}$ (or INTERNAL_VDDQ) in FIG. 1). With this model in mind, problems are observed as being caused by inductance and resistance when it is desired to charge a relatively large capacitance in a very short time, i.e., on the order of nanoseconds (ns).

In these cases, a large amount of current is flowed involving a significant drop on the resistance. If left uncontrolled, fluctuations of the power current dropped at the resistance induce drops or overshoots of the values of the internal power $VDDQ_{internal}$ (by the inductance).

These drops and overshoots may generate variations of the values of $VDDQ_{internal}$ resulting in undesirable consequences. For example, an uncontrolled drop of $VDDQ_{internal}$ below a trigger point voltage may turn off p-mos transistors that take VDDQ as a high reference voltage. Also, an eventual $VDDQ_{internal}$ drop below the trigger point voltage may slow output switching for those transistors that have $V_{gate}$ equal to zero. This undesired effect may occur due to delays associated with waiting for the VDDQ to recover before detecting the $V_{out}$ logic value to be "1".

The charging and discharging of the output data pin, i.e., characterized by a relatively large capacitance, is one of the situations wherein this effect may produce significant undesirable effects. To prevent these effects, current control may be provided when the output buffers are switching on.

The control of the VDDQ absorbed current may be achieved by different techniques. One technique is controlling the p-mos buffer turn on. The buffer elements are not switched on in digital mode, as is typical with traditional architectures, but their VGS absolute values rise in time with a pending control.

FIG. 2, e.g., schematically illustrates a conventional architecture. The conventional architecture of FIG. 2 has $VDDQ_{internal}$ connected to the p-mos (P4) transistors $M_0$ and $M_3$. The p-mos transistor $M_3$ is connected to n-mos (N) transistor $M_2$. The p-mos transistor $M_0$ is connected to n-mos (N) transistor $M_1$. The n-mos transistors $M_1$ and $M_2$ are each also connected to ground. An input control signal $data_{out}$ (or OUT_DATA in FIG. 2) controls each of the p-mos transistor $M_3$ and the n-mos transistor $M_2$. The output of the p-mos transistor $M_3$ controls each of p-mos transistor $M_0$ and n-mos transistor $M_1$. The output of the p-mos transistor $M_0$ is connected to capacitor $C_{out}$.

The discharge current may be controlled, as in the circuit of FIG. 2, by the turning to ground of the gate of the p-mos transistor $M_0$ when $data_{out}$ is low. In this way, current absorbed by the out buffer, when the output data changes from "0" to "1", has a continuous profile in the time without abrupt variations.

RECOGNIZED IN THE INVENTION

It is recognized in the present invention that a determination of the value of the gate discharge current may be achieved by modifying the circuit of FIG. 2 in different ways according to FIG. 3. These modifications each include insertion of a device D between the output of p-mos transistor $M_6$ corresponding to p-mos transistor $M_3$ of FIG. 2, and n-mos transistor $M_4$, corresponding to n-mos transistor $M_2$ of FIG. 2. The output of p-mos transistor $M_6$ still controls p-mos transistor $M_7$, corresponding to p-mos transistor $M_0$ of FIG. 2. The n-mos transistor $M_5$, corresponding to n-mos transistor $M_1$ of FIG. 2, is now controlled by the digital N-control. Specific modifications include adding a discharge resistor as the device D, as in the circuit of FIG. 4, or adding a mirrored current transistor as the device D, as in the circuit of FIG. 5.

Referring to FIG. 4, the discharge resistor (RP) $R_1$ may be inserted between the output of the p-mos transistor $M_{10}$ corresponding to the p-mos transistor $M_3$ of FIG. 2, and the n-mos transistor $M_8$ corresponding to the n-mos transistor $M_2$ of FIG. 2. The output of p-mos transistor $M_{10}$ would still control the p-mos (P4) transistor $M_{11}$ corresponding to the p-mos transistor $M_0$ of FIG. 2. The n-mos transistor (N) $M_9$ of the circuit of FIG. 4, and corresponding to the n-mos transistor $M_1$ of FIG. 2, would be controlled by digital N-control, rather than by the output of p-mos transistor $M_{10}$ as in the circuit of FIG. 2.

Referring to FIG. 5, the mirrored current transistor $M_{16}$ may be inserted between the output of the p-mos transistor $M_{14}$ corresponding to the p-mos transistor $M_3$ of FIG. 2, and the n-mos transistor $M_{12}$ corresponding to the n-mos transistor $M_2$ of FIG. 2. The mirrored current transistor $M_{16}$ is controlled by $I_{mirror}$ (or I_MIRROR in FIG. 5). The output of p-mos transistor $M_{14}$ would still control the p-mos (P4) transistor $M_{15}$ corresponding to the p-mos transistor $M_0$ of FIG. 2. The n-mos transistor (N) $M_{13}$ of the circuit of FIG. 5 would be controlled by digital N-control, rather than by the output of p-mos transistor $M_{14}$ as in the circuit of FIG. 2.

The solutions described above with reference to FIGS. 4 and 5 may solve the problem of VDDQ drop, because the buffer turn on is controlled. However, these solutions are not preferred herein for avoiding overshoot of VDDQ when $C_{out}$ is charged and the current goes to zero. These solutions do not involve an active control because the resistance value of $R_1$ or mirrored current value of $M_{16}$ are determined at the time the circuit is designed and are not later modifiable. It is desired to have an active control which prevents the VDDQ drop and overshoot problems described above.

SUMMARY OF THE INVENTION

In view of the above, an output buffer switch-on control is provided for avoiding internal VDDQ drop and overshoot with a limited circuital overhead. Eventual VDDQ variations are automatically corrected by active controlling implemented by an output voltage feedback arrangement.

A particularly preferred output buffer switch-on control circuit includes at least four transistors. The first transistor has a first terminal connected to an internal voltage line and is controlled by an output data source. The second transistor} has a first terminal connected to the internal voltage line and is controlled by a second terminal of the first transistor. The second transistor also has a second terminal connected to a first terminal of an output capacitor. The third transistor is controlled by the output data source and has a first terminal connected to a common voltage. The fourth transistor is digitally controlled and has a first terminal connected to the second terminal of the second transistor and has a second terminal connected to the common voltage. The switch-on control circuit further includes a discharge current control circuit connected between a second terminal of the first transistor and a second terminal of the third transistor. The discharge current control circuit is advantageously preferably actively-controlled.

The discharge current control circuit preferably includes a discharge resistor and a mirrored current transistor. The mirrored current transistor is preferably controlled by a connection between the second terminal of the second transistor and the first terminal of the fourth transistor. The mirrored current transistor preferably includes a first terminal connected to the second terminal of the first transistor and preferably also includes a second terminal connected to the discharge resistor. The discharge resistor is preferably connected between the mirrored current transistor and the third transistor. The first and second transistors preferably comprise p-type MOSFETS, and the third and fourth transistors comprise n-type MOSFETS. A second terminal of the output capacitor is preferably connected to the common voltage.

INCORPORATION BY REFERENCE

The above sections entitled, "BACKGROUND", "RECOGNIZED IN THE INVENTION", "SUMMARY OF THE INVENTION", and "BRIEF DESCRIPTION OF THE DRAWINGS" are each hereby incorporated by reference into the below section entitled, "DETAILED DESCRIPTION OF THE PREFERRED EMBODIMENT", as disclosing alternative embodiments of elements or features of the preferred embodiment not otherwise set forth in detail below.

DETAILED DESCRIPTION OF THE PREFERRED EMBODIMENT

The output buffer switch-on control circuit of the preferred embodiment includes a discharge current control circuit which is preferably actively-controlled. The preferred discharge current control circuit solves the VDDQ overshoot problem described in the background. The control of the VDDQ drop is preferably active. Preferably, a p-mos transistor is inserted into the gate discharge path. This transistor is controlled by the $V_{out}$ voltage (or $C_{out}$ in FIG. 6).

Figure 6:
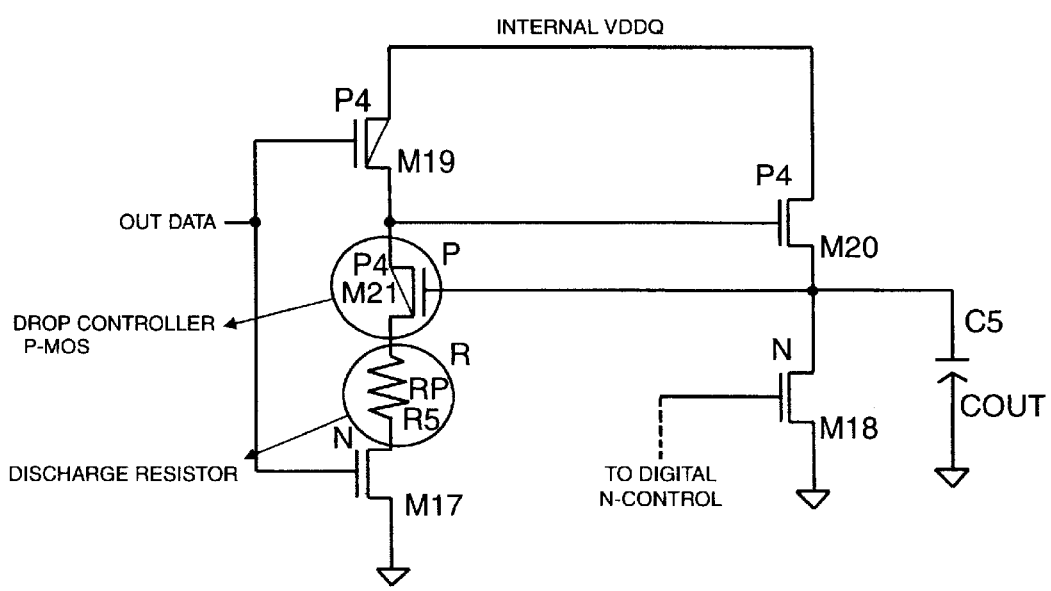
FIG. 6 schematically illustrates a drop controller transistor and discharge resistor combination with output voltage feedback according to a preferred embodiment.

Referring to FIG. 6, a first p-mos transistor $M_{19}$ has a first terminal connected to $VDDQ_{internal}$. The first p-mos transistor $M_{19}$ is controlled by $data_{out}$, as shown. A second p-mos transistor $M_{20}$ has a first terminal also connected to $VDDQ_{internal}$. The second p-mos transistor $M_{20}$ is controlled by connection to the second terminal of the first p-mos transistor $M_{19}$. A first n-mos transistor $M_{17}$ is also controlled by $data_{out}$, and has a first terminal connected to a common voltage, such as ground. A second n-mos transistor $M_{18}$ is digital N-controlled, has a first terminal connected to the second terminal of the second p-mos transistor $M_{20}$, and has a second terminal connected the common voltage.

The preferred discharge current control circuit includes a mirrored current, preferably of p-mos type, transistor $M_{21}$ that is feedback controlled by $V_{out}$ (or $C_{out}$ in FIG. 6). The second terminal of the second p-mos transistor $M_{20}$ and first terminal of the second n-mos transistor $M_{18}$ are each also preferably connected to $V_{out}$ (or $C_{out}$), and thus also to the gate of the mirrored current p-mos transistor $M_{21}$. The preferred discharge current control circuit further preferably includes a discharge resistor $R_5$. The mirrored current transistor $M_{21}$ has a first terminal connected to the second terminal of the first p-mos transistor $M_{19}$ which controls the second p-mos transistor $M_{20}$. The second terminal of the mirrored current transistor $M_{21}$ is connected to the discharge resistor $R_5$. The discharge resistor $R_5$ is, in turn, connected between the mirrored current transistor $M_{21}$ and the second terminal of the first n-mos transistor $M_{17}$.

During turn on, the buffer gate discharge current is defined by the resistor "R" and the p-mos "P" resistance, as shown in respective circles in FIG. 6. An eventual VDDQ drop is immediately stopped by the resistance of the p-mos transistor $M_{21}$ which rises with the value of $V_{out}$ (or $C_{out}$). The drop control is "active", because it depends on the value of $V_{out}$ (or $C_{out}$), which rises in time. The system is able to autorecover these VDDQ drop problems.

Moreover, the rise of $V_{out}$ ($C_{out}$) induces a proportional turn off of the mirrored current transistor $M_{21}$, or p-mos "P" of FIG. 6, which "brakes" the switching-on of the output buffer. In this way, the current which charges the $C_{out}$ output capacitor decreases in the time with a limitation on the VDDQ overshoot value. This provides a remarkable reduction of voltage stress induced in the transistors (these stresses may otherwise cause damage in low voltage devices).

Figure 1:
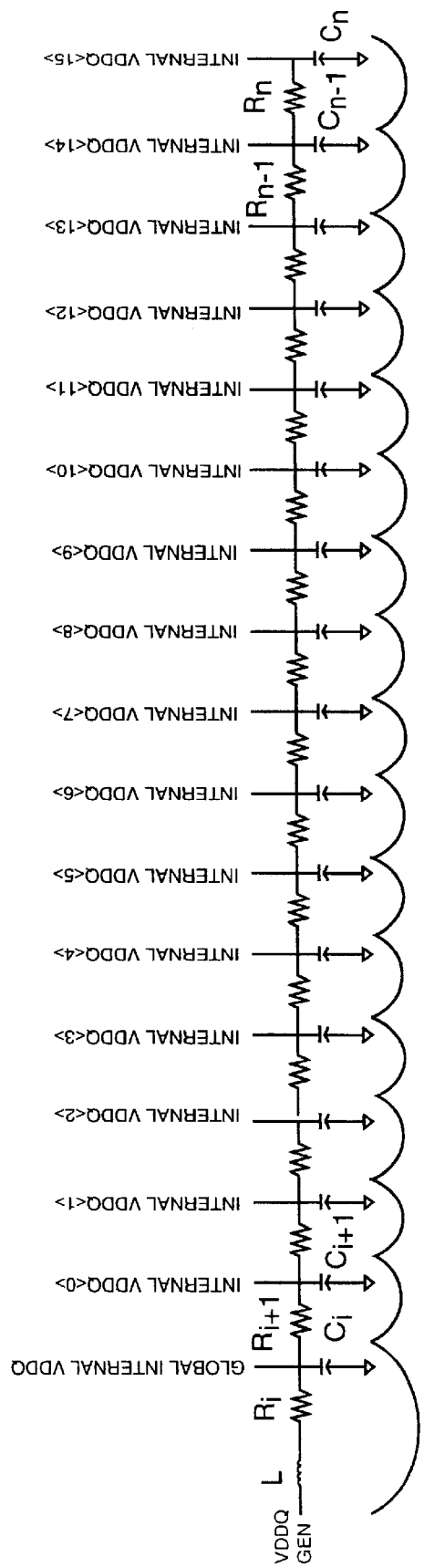
FIG. 1 schematically illustrates a schematic representation of a simplified RLC model illustrating an output buffer between an external pin and transistors of an integrated device.

In addition, the output buffer switch-on control circuit according to the preferred embodiment generally depends on the RLC value of $VDDQ_{out}$ according to the model schematically illustrated at FIG. 1. In the device of the preferred embodiment, the switch-on technique may be varied by employing a group of fuses to adapt switch-on circuit to real requirements of a physical device.

Results

Figure 2:
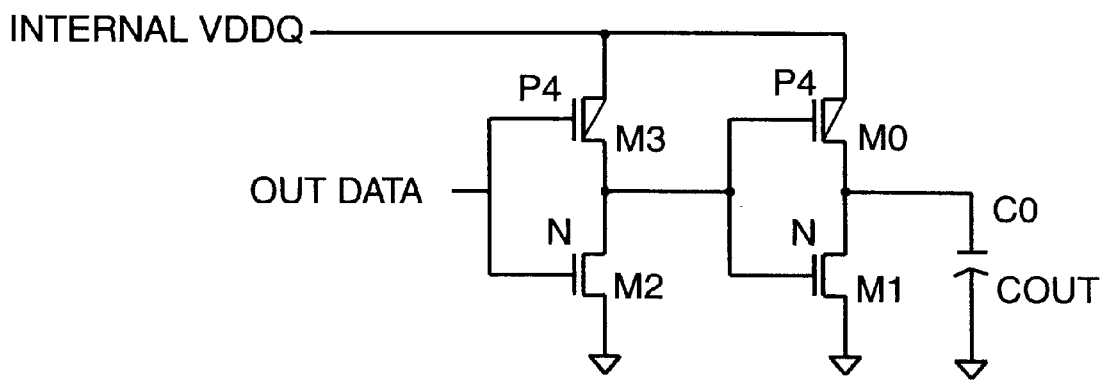
FIG. 2 schematically illustrates a conventional current control for the switching on of output buffers.
Figure 3:
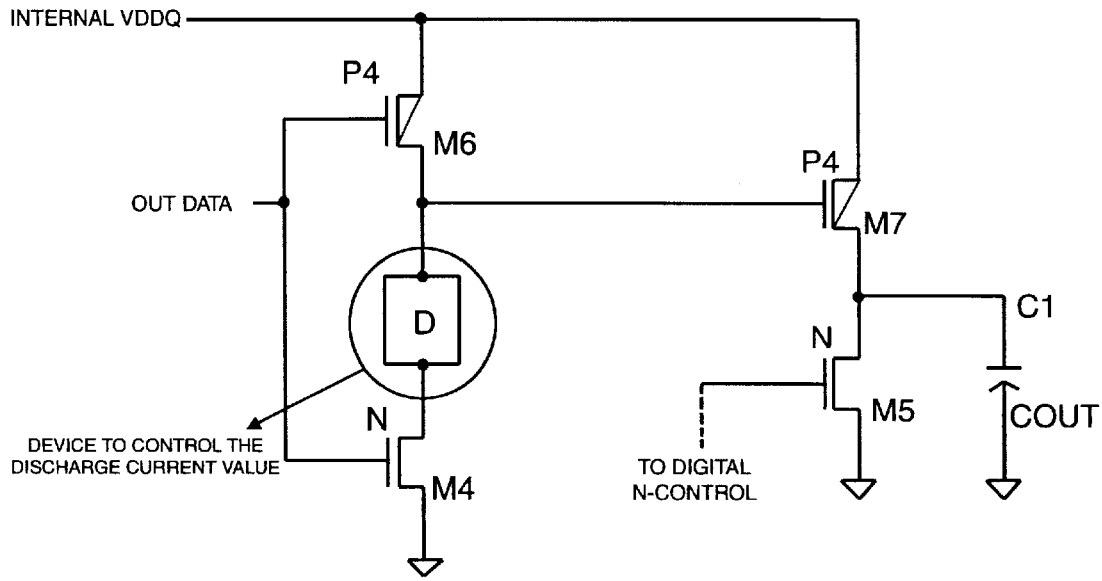
FIG. 3 schematically illustrates a modified current control for the switching on of output buffers including a discharge current control device.
Figure 4:
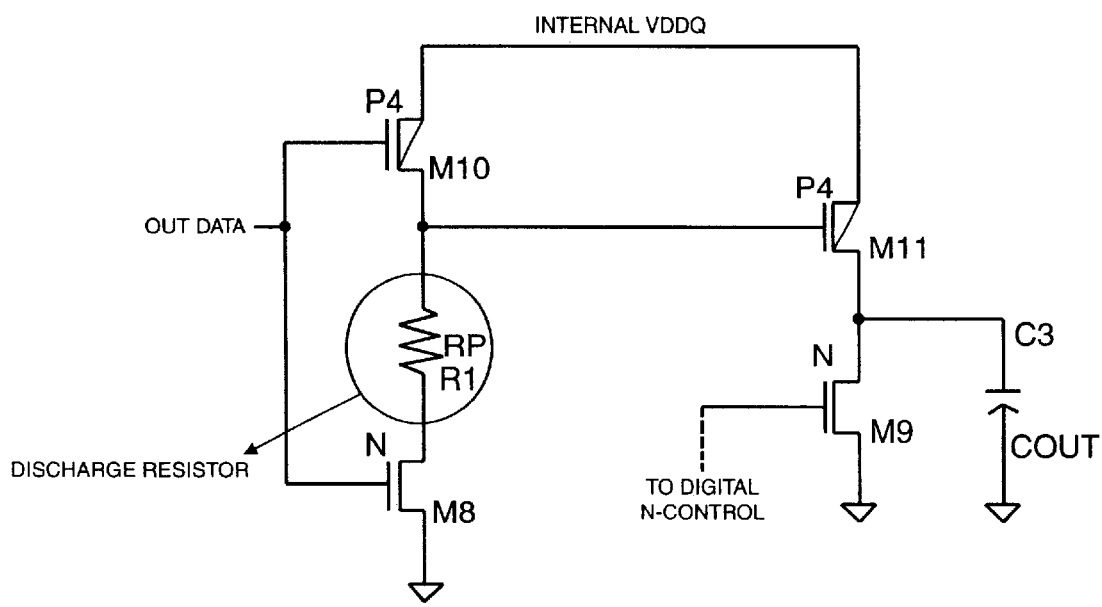
FIG. 4 schematically illustrates a discharge resistor as an example of the discharge current control device of FIG. 3.
Figure 5:
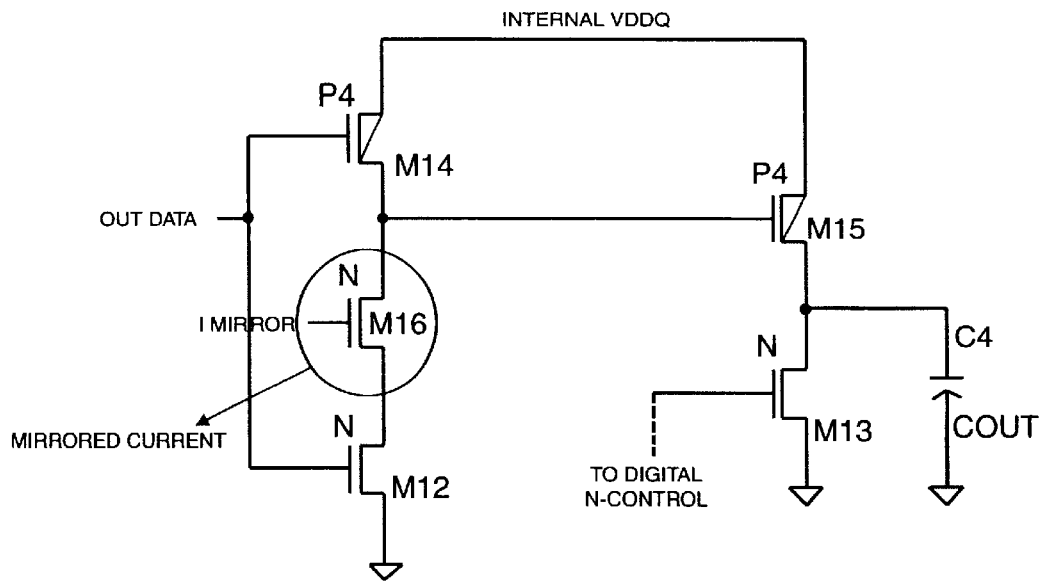
FIG. 5 schematically illustrates a mirrored current transistor as another example of the discharge current control device of FIG. 3.
Figure 7:
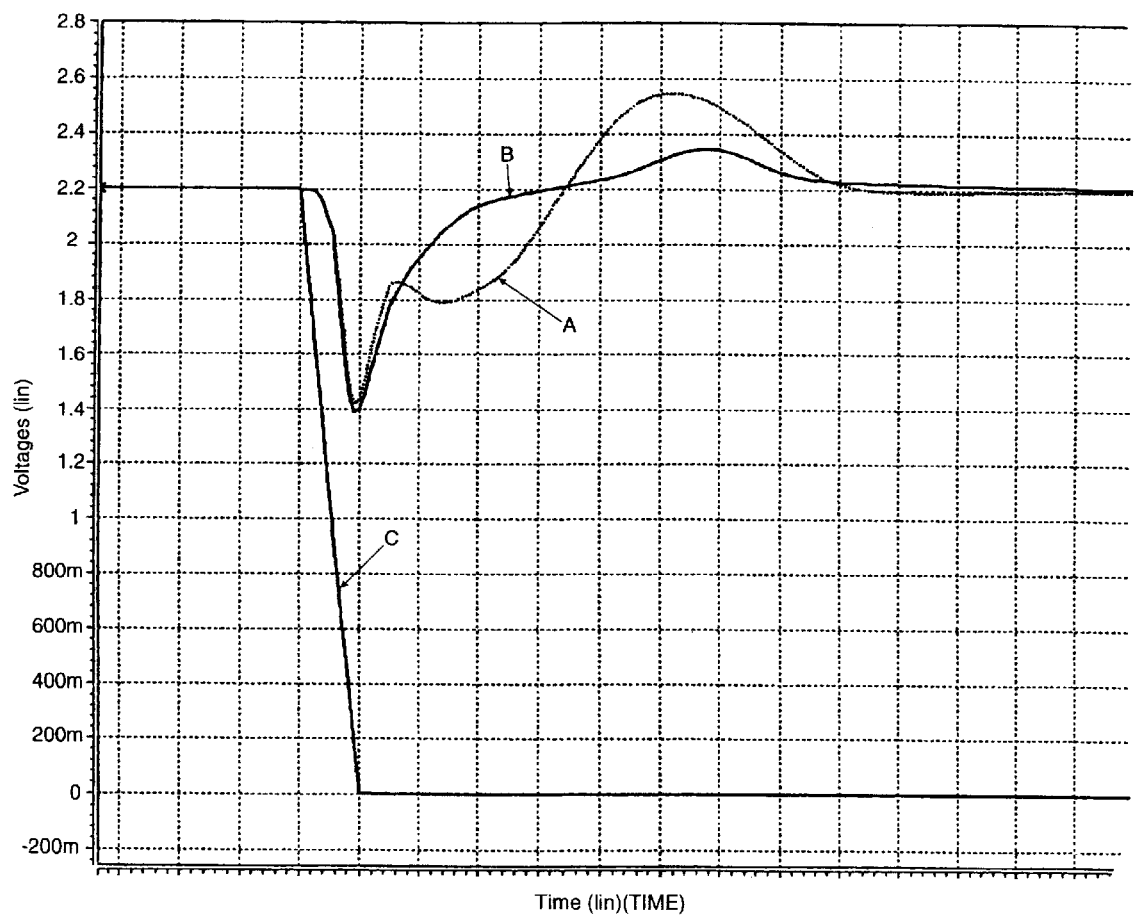
FIG. 7 shows comparative simulation plots of VDDQ voltage versus time for a switch-on circuit with conventional discharge current control and for a switch-on circuit with discharge current control according to a preferred embodiment, along with a plot of the simulated $V_{out}$ for the output capacitor used for generating the VDDQ plots.

The introduction of the current mirrored transistor $M_{21}$, or p-mos "P" transistor of FIG. 6, into the gate discharge path of the output buffer provides advantageous control of VDDQ variations. FIG. 7 shows comparative simulation plots of VDDQ voltage versus time. Plot A of FIG. 7 shows a VDDQ plot for a switch-on circuit with conventional discharge current control, e.g., such as that described above with reference to FIG. 2. Plot B of FIG. 7 shows a VDDQ plot for a switch-on circuit with discharge current control according to a preferred embodiment, e.g., such as that described herein with reference to FIG. 6. Plot C of FIG. 7 shows a plot of a digital signal used as an enable command for changing the value of the output that was used in generating the simulation plots A and B. For the simulations of plots A and B of FIG. 7, the capacitance of the $C_{out}$ capacitor was 50 pF, and external VDDQ was 2.2 V, and the temperature was T=−40° C.

As may be clearly observed from a comparison of plots A and B, the voltage of plot B according to the circuit of the preferred embodiment exhibits greater stability and reduced fluctuations than the voltage of plot A according to the conventional circuit. The VDDQ drop has the same value, i.e., from 2.2 to 1.4, in both plot A and plot B. However, the p-mos controller induces an evident decrement in the duration of the VDDQ undershoot time. An analogue improvement is visible for the overshoot control. In fact, plot B according to the circuit of the preferred embodiment is practically free of VDDQ overshoot, while plot A according to the conventional circuit exhibits a very large overshoot.

Figure 8:
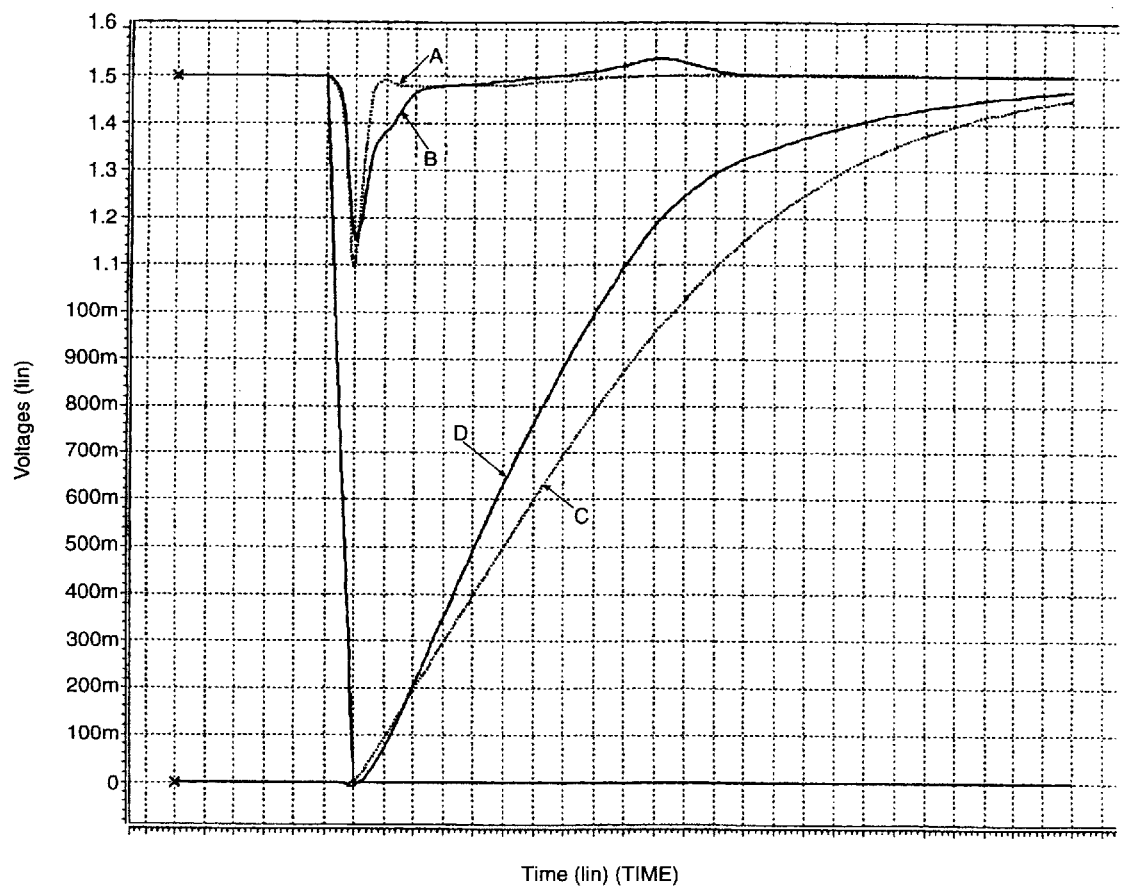
FIG. 8 shows comparative plots of VDDQ voltage versus time for a switch-on circuit with conventional discharge current control and for a switch-on circuit with discharge current control according to a preferred embodiment, along with comparative plots of $V_{out}$ for the output capacitor also for each of a switch-on circuit with conventional discharge current control and for a switch-on circuit with discharge current control according to a preferred embodiment.

FIG. 8 shows further comparative plots of VDDQ voltage versus time. Plot A shows voltage versus time for a switch-on circuit with conventional discharge current control. Plot B shows voltage versus time for a switch-on circuit with discharge current control according to a preferred embodiment. FIG. 8 also shows comparative plots of $V_{out}$ for the output capacitor. Plot C shows $V_{out}$ versus time for a switch-on circuit with conventional discharge current control. Plot D shows $V_{out}$ versus time for a switch-on circuit with discharge current control according to a preferred embodiment. For the plots A–D of FIG. 8, the capacitance of the $C_{out}$ capacitor was 50 pF, and external VDDQ was 1.5 V, and the temperature was T=125° C. As with the plots of FIG. 7, a digital signal was used as an enable command for changing the value of the output. Dimensions of the uncontrolled buffer are those limiting VDDQ drop.

FIG. 8 illustrates that with a comparable VDDQ drop and overshoot for the conventional case (plot A) and for the circuit of the preferred embodiment (plot B), controlling the $V_{out}$ rise is quicker the p-mos discharge gate controller of the preferred embodiment. Advantageously, the time to charge $C_{out}$ to the trigger point voltage (i.e., VDDQ/2) is shown as being about 20% faster for the circuit of the preferred embodiment compared with the conventional circuit.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The scope of the invention is thus not limited by the particular embodiments described above. Instead, the scope of the present invention is understood to be encompassed by the language of the claims that follow, and structural and functional equivalents thereof.

We claim:

1. An output buffer switch-on control circuit, comprising:
   a first transistor having a first terminal connected to an internal voltage line and controlled by an output data source;
   a second transistor having a first terminal connected to the internal voltage line and controlled by a second terminal of the first transistor and having a second terminal connected to an output capacitor;
   a third transistor controlled by the output data source and having a first terminal connected to a common voltage;
   a fourth transistor that is digitally controlled and has a first terminal connected to the second terminal of the second transistor and has a second terminal connected to the common voltage; and
   a discharge current control circuit connected between a second terminal of the first transistor and a second terminal of the third transistor.

2. The switch-on control circuit of claim 1, wherein the discharge current control circuit includes a discharge resistor.

3. The switch-on control circuit of claim 1, wherein the discharge current control circuit includes a mirrored current transistor.

4. The switch-on control circuit of claim 3, wherein the discharge current control circuit further includes a discharge resistor.

5. The switch-on control circuit of claim 4, wherein the a mirrored current transistor includes a first terminal connected to the second terminal of the first transistor and includes a second terminal connected to the discharge resistor, the discharge resistor being connected between the mirrored current transistor and the third transistor.

6. An output buffer switch-on control circuit, comprising:
   a first transistor having a first terminal connected to an internal voltage line and controlled by an output data source;
   a second transistor having a first terminal connected to the internal voltage line and controlled by a second terminal of the first transistor and having a second terminal connected to a first terminal of an output capacitor;
   a third transistor controlled by the output data source and having a first terminal connected to a common voltage;
   a fourth transistor that is digitally controlled and has a first terminal connected to the second terminal of the second transistor and has a second terminal connected to the common voltage; and
   an actively-controlled, discharge current control circuit connected between a second terminal of the first transistor and a second terminal of the third transistor.

7. The switch-on control circuit of claim 6, wherein the discharge current control circuit includes a discharge resistor.

8. The switch-on control circuit of claim 6, wherein the discharge current control circuit includes a mirrored current transistor.

9. The switch-on control circuit of claim 8, wherein the mirrored current transistor is controlled by a connection between the second terminal of the second transistor and the first terminal of the fourth transistor.

10. The switch-on control circuit of claim 8, wherein the discharge current control circuit further includes a discharge resistor.

11. The switch-on control circuit of claim 10, wherein the mirrored current transistor includes a first terminal connected to the second terminal of the first transistor and includes a second terminal connected to the discharge resistor, the discharge resistor being connected between the mirrored current transistor and the third transistor.

12. The switch-on control circuit of claim 10, wherein the mirrored current transistor is controlled by a connection between the second terminal of the second transistor and the first terminal of the fourth transistor.

13. The switch-on control circuit of claim 12, wherein the mirrored current transistor includes a first terminal connected to the second terminal of the first transistor and includes a second terminal connected to the discharge resistor, the discharge resistor being connected between the mirrored current transistor and the third transistor.

14. The switch-on control circuit of claim 6, wherein the first and second transistors comprise p-type MOSFETS, and the third and fourth transistors comprise n-type MOSFETS.

15. The switch-on control circuit of claim 6, wherein a second terminal of the output capacitor is connected to the common voltage.

16. An output buffer switch-on control circuit, comprising:
    a plurality of transistors, at least two including a first and a second transistor being controlled by an output data source;
    an output capacitor connected to a terminal of at least one of the plurality of transistors; and
    an actively-controlled, discharge current control circuit disposed between said first and second transistors and including a mirrored current transistor and a discharge resistor, the mirrored current transistor being feedback controlled by the output capacitor.

17. The switch-on control circuit of claim 16, wherein the output capacitor is connected to a terminal of each of a third and a fourth transistor of the plurality of transistors.

18. An actively-controlled, discharge current circuit for controlling a discharge current of an output buffer switch-on control circuit, comprising:
    a mirrored current transistor feedback controlled by an output capacitor of the switch-on control circuit; and
    a discharge resistor connected to a second terminal of the mirrored current transistor.

19. The discharge current circuit of claim 18, wherein a first terminal of the mirrored current circuit controls a first transistor of the switch-on control circuit.

20. The discharge current circuit of claim 19, the discharge current circuit being connected between a pair a transistors each controlled by an output data source, a first transistor of the pair being connected between an internal voltage and the second terminal of the mirrored current transistor, a second transistor of the pair being connected between the resistor and a common voltage, the output capacitor also being connected to a terminal of each of the first transistor of the switch-on control circuit and a fourth transistor that is digitally controlled.

* * * * *